United States Patent
Roeckner

Patent Number: 6,041,007
Date of Patent: Mar. 21, 2000

[54] DEVICE WITH PROGRAMMABLE MEMORY AND METHOD OF PROGRAMMING

[75] Inventor: William Roeckner, Carpentersville, Ill.

[73] Assignee: Motorola, Inc., Schaumburg, Ill.

[21] Appl. No.: 09/017,393

[22] Filed: Feb. 2, 1998

[51] Int. Cl.$^7$ ............................................. G11C 7/00
[52] U.S. Cl. ........................ 365/225.7; 365/185.21; 365/226
[58] Field of Search ..................... 365/225.7, 218, 365/189.11, 185.29, 185.33, 185.21, 226

[56] References Cited

U.S. PATENT DOCUMENTS

| | | |
|---|---|---|
| T930,005 | 1/1975 | Chia et al. . |
| 3,082,374 | 3/1963 | Buuck . |
| 3,237,100 | 2/1966 | Chalfin et al. . |
| 3,492,872 | 1/1970 | Jones et al. . |
| 3,714,403 | 1/1973 | Ammann et al. ................ 235/153 |
| 3,961,252 | 6/1976 | Eichelberger ..................... 324/73 |
| 4,519,078 | 5/1985 | Komonytsky ..................... 371/25 |
| 4,590,552 | 5/1986 | Guttag et al. ..................... 364/200 |
| 4,890,263 | 12/1989 | Little ................................. 365/218 |
| 5,345,413 | 9/1994 | Fisher et al. ...................... 365/96 |
| 5,357,572 | 10/1994 | Bianco et al. .................... 380/23 |
| 5,371,748 | 12/1994 | Saw et al. ......................... 372/27 |
| 5,469,557 | 11/1995 | Salt et al. ......................... 395/425 |
| 5,574,879 | 11/1996 | Wells et al. ...................... 395/427 |
| 5,631,862 | 5/1997 | Cutter et al. ..................... 365/96 |
| 5,812,468 | 9/1998 | Shirley ............................. 365/200 |

*Primary Examiner*—David Nelms
*Assistant Examiner*—Hien Nguyen
*Attorney, Agent, or Firm*—Nicholas C. Hopman

[57] ABSTRACT

A device, preferably an electronically calibrated sensor (100) includes a sensing element (102) with an output coupled to a calibration circuit (104). The calibration circuit (104) includes an electronically erasable programmable read only memory (EEPROM) (114). An EEPROM fuse (204) is employed in association with the EEPROM (114) which in a programming-disable logical state disables the write/erase program logic (208). The EEPROM fuse (204) may only be erased upon a valid fuse override signal (232) the input for which (224) in a final packaged device is inaccessible.

23 Claims, 3 Drawing Sheets

DEVICE WITH PROGRAMMABLE MEMORY AND METHOD OF PROGRAMMING

FIELD OF THE INVENTION

The present invention relates generally to programmable memory. The described approach is useful in sensors and sensor calibration and more particularly to an electrically erasable programmable read only memory (EEPROM) for use in electronically calibrated sensors and a method of programming the same.

BACKGROUND OF THE INVENTION

The world is full of sensor devices for detecting physical phenomenon and for providing a signal in response to the phenomenon. For example, a thermometer converts the physical condition temperature into a visual signal, a height of mercury in a glass column. Another example of a temperature-sensing device is a thermocouple which converts the physical condition temperature into an electrical signal. To be useful the sensor signal has to be understood to correspond with a particular physical phenomenon. For example, the thermometer has lines on the glass column to indicate the degrees of temperature. The lines, of course, have to be in the right locations on the glass column to have meaning, and the process by which the lines are properly located is known as calibration. During calibration the sensor is subjected to a known physical condition or conditions and its response is observed. Observing the response of the sensor to the known conditions allows one to predict the sensor response for a wide range of conditions.

Pressure sensors are devices that provide a signal indicative of pressure, for example, the amount of air pressure within a tire. As with other types of sensors, pressure sensors require calibration to be useful. A specific kind of pressure sensor known as a piezoresistive pressure sensor provides a voltage signal indicative of pressure. The piezoresistive pressure sensor poses a number of problems in application. For example, the piezoresistive sensing element provides a relatively low level voltage signal. In addition, the piezoresistive sensing element may provide a signal that is sensitive to changing temperature and that does not change linearly with changing pressure. Moreover, the signal voltage characteristic from one sensing element to another sensing element may not be consistent. Therefore, special signal conditioning circuitry is required for a sensor product that provides a high level sensor output that is sufficiently accurate across a wide range of operating temperatures and pressures. Importantly, the device has to be capable of mass production, at low cost and with a high degree of part-to-part repeatability.

Most low cost signal conditioning approaches use analog circuits that are adjusted during a calibration process. For example, it is known to use amplifier circuits coupled to resistor networks. In one such application, the resistor network includes a number of resistive elements coupled by fusible links. Though limited in the degree of adjustment available, various resistive values may be established for providing an acceptable output from the amplifier network. In another application, the resistor network includes laser trimmable resistive elements. During a calibration process, the resistive elements are trimmed using a laser to achieve the correct resistive values to provide an acceptable output from the amplifier network. In either application access to the circuit may be required during processing in order to fuse links and/or laser trim components. Hence manufacturing processing options are limited. Also, in certain applications offset, sensitivity and linearity may be difficult to compensate for independently. Furthermore, processing activities following calibration may introduce error that can not be corrected in the final product. And, the laser trim process requires expensive processing hardware and suffers increased cycle time.

An alternative design provides for electronic calibration of the sensing element. Sensors adapted for electronic calibration have included a microprocessor coupled to the sensor element via suitable signal conditioning circuitry and to a memory in which a calibration algorithm is retained. During processing, the sensing element is tested under various known-operating conditions. Calibration values are established and stored in the memory. In operation, these data are accessed and utilized by the sensor to provide a reliable sensor output. The memory is typically an electronically erasable programmable read only memory (EEPROM) to which the calibration data may be written during manufacture of the sensor or once installed in an application. As a result of the flexibility in application and ease of manufacture, electronically calibrated sensors are highly desirable.

It is common for electronically calibrated sensors to find application in harsh environments. For example, pressure sensors find application in industrial processing plants, internal combustion engine controllers, and the like. It is not unusual for these environments to not only be physically harsh but electronically noisy. For example, in applications for controlling internal combustion engines in automobiles, the electrical environment may include ignition spark noise, fuel-injector driver noise and high power pulse-width modulation motor controller noise to name just a few forms of electrical noise to which the sensor may be subjected. It is therefore very important that the calibration data stored in the memory be protected from corruption and/or accidental erasure resulting from exposure to the electronic noise.

Inadvertent writes or erases of an EEPROM device may occur from a random power-up state of the write/erase digital control logic which forms part of the device. Data may also be accidentally overwritten if the proper sequence of external random events on the accessible pins of the sensor module places it in a write or erase mode. Such random events may result from electrical noise in the sensor operating environment.

A number of strategies have been employed to protect the memory of electronic devices that utilize EEPROM memory. For example, to protect against inadvertent writes or erases resulting from random power-up states of the write/erase digital control logic, a power-on reset (POR) circuit is often used. The POR ensures that the write/erase digital control logic always powers on in a safe, write protected mode. However, it is very difficult to design a POR to protect against all possible electronic noise conditions, the POR will require valuable die area in the circuit design, and the POR only protects against power-on conditions and not against conditions that may occur after power-up.

Certain prior art teach an electronically erasable (EE) fuse structure within a memory device to maintain the secrecy of the data. The data is inaccessible with the fuse set. Resetting the fuse results in erasure of the data. This arrangement does not provide protection of the data from unauthorized or inadvertent writing or erasure of the data.

Therefore, there remains a need for a cost effective electronically calibrated sensing device including a protected EEPROM. The preferred device will provide robust protection for data written to the EEPROM under all operating conditions, and including highly electronically noisy conditions. In addition, the device will be efficient in its circuit implementation, accept allowed reprogramming, be directly testable and not require additional pins when packaged in an integrated circuit (IC) package.

DETAILED DESCRIPTION OF THE PREFERRED EMBODIMENTS

In an electronically calibrated sensor, a sensing element output is coupled to a calibration, or signal processing, circuit that includes an electronically erasable programmable read only memory (EEPROM). The calibration circuit is adapted to be highly computationally efficient and operable for linearizing and scaling the sensing element output for providing a useable sensor output signal. The memory includes a memory protection circuit including an EEPROM fuse for protecting the memory against inadvertent writes and/or erases resulting from random power-up states or random noise. The sensing device is preferably manufactured and packaged prior to calibration so as to avoid any post-calibration processing error. The calibration data is written to the EEPROM and the memory protection circuit is enabled. It will be appreciated that the memory protection circuit, though described in terms of a preferred implementation associated with a pressure sensing device has application to any EEPROM application. Therefore, no limitation of the application of the present invention should be drawn from the following discussion of a preferred, exemplary implementation in association with a piezoresistive pressure sensing device.

Figure 1:
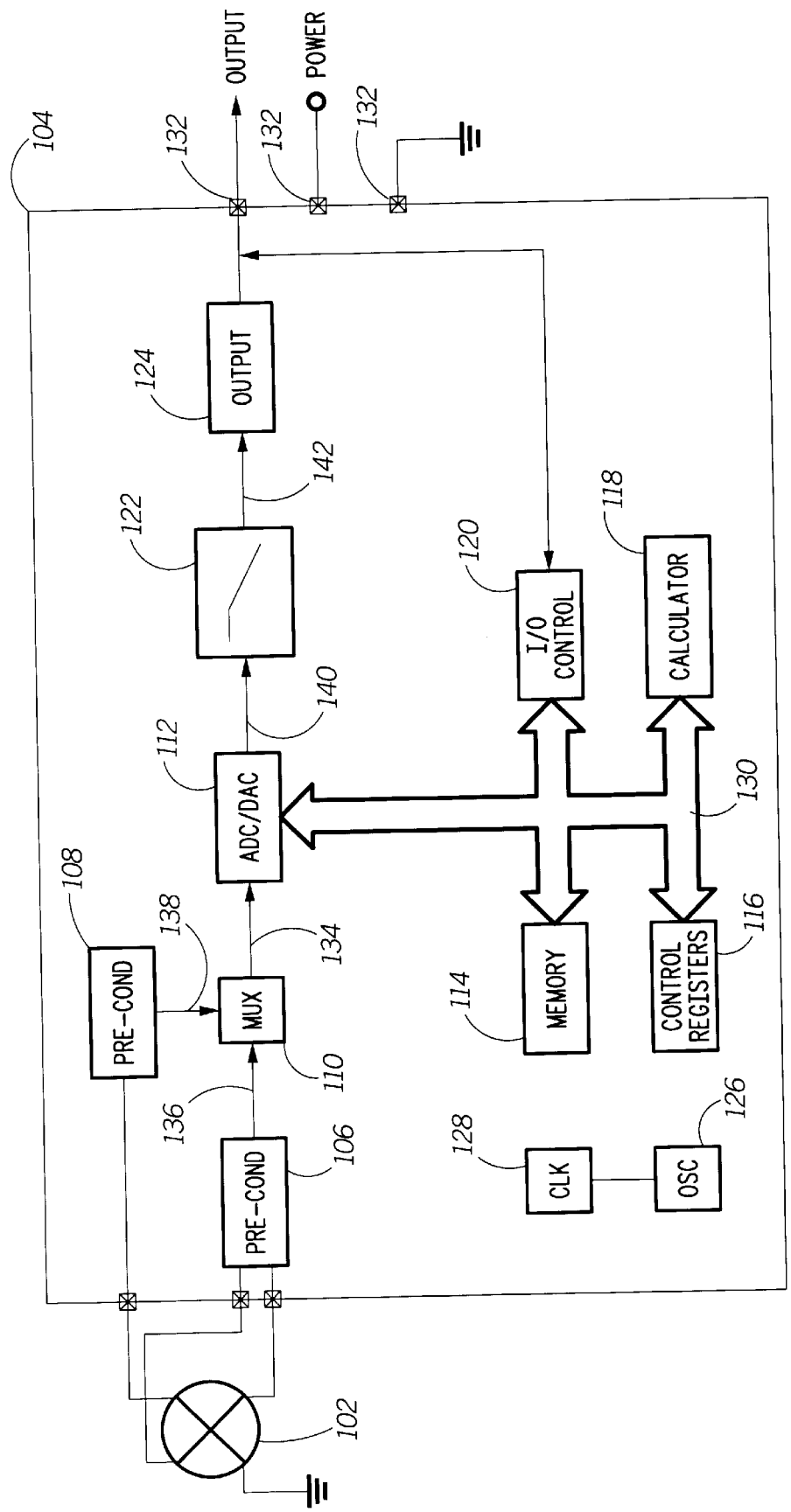
FIG. 1 is a schematic diagram illustrating a signal conditioning circuit for a sensing device in accordance with a preferred embodiment the present invention.

With reference to FIG. 1, a sensor 100 in accordance with a preferred embodiment is shown and includes a sensing element 102 coupled to a signal conditioning circuit 104. Signal conditioning circuit 104 is preferably implemented as a single chip, integrated circuit and includes pressure signal pre-conditioning circuitry 106, temperature signal pre-conditioning circuit 108, multiplexer 110, analog-to-digital/digital-to-analog converter (ADC/DAC) 112, electronically erasable programmable read only memory (EEPROM) 114, control memory registers 116, polynomial calculator 118, input/output (I/O) controller 120, output filter 122 and output driver 124. Circuit 104 further includes an oscillator 126 coupled to a clock generator 128 having an output suitably coupled to the foregoing circuit elements as is known in the art. Furthermore, one of ordinary skill in the art will appreciate that in accordance with sound design practice circuit 104 will further include over-voltage protection, an operating voltage generator, power-on-reset function, and test logic (not shown).

Sensing element 102 is preferably a piezoresistive sensing element formed as a portion of a semiconductor die as is know in the art for providing a pressure indicative signal. In preferred implementations, sensing element 102 may be formed as a separate element and coupled to signal conditioning circuit 104 (as shown in FIG. 1) or may be formed integral as part of a processing circuit chip. Sensing element 102 further provides a temperature signal. In an alternate embodiment, a separate temperature sensing device may be included to provide the temperature signal. The output of sensing element 102 is a relatively low-level signal that generally varies with temperature and is subject to substantial part-to-part variation. The output of sensing element 102 may also include certain non-linear properties. Accordingly, the output of sensing element 102 is operated upon by signal conditioning circuit 104 for providing a temperature compensated substantially linear signal in a usable voltage range.

More specifically, the pressure and temperature outputs of sensing element 102 are coupled to pressure and temperature pre-conditioning circuitry 106 and 108, respectively, for initially filtering, amplifying and applying an offset to the sensing element 102 output signals. The pre-conditioned pressure and temperature signals are then selectively coupled via multiplexer 110 to ADC/DAC 112. ADC/DAC 112 operates on the pre-conditioned signals for providing, respectively, digital pressure and temperature signals.

From ADC/DAC 112, the digital pressure and temperature signals are coupled via bus 130 to control registers 116 and polynomial calculator 118. EEPROM 114 includes a data storage portion and more particularly storage for a plurality of calibration data for use by polynomial calculator 118 in providing a compensated pressure sensor signal. Output signals from polynomial calculator 118 are coupled via bus 130 to ADC/DAC 112 where the digital output signal is converted back to an analog output signal. The analog output signal is filtered using filter 122 and amplified for output by output driver 124. I/O control device 120 provides an ability to access and operate upon, such as writing to EEPROM 114, from external to sensor 100 while utilizing a minimum number of pins 132. .

Figure 2:
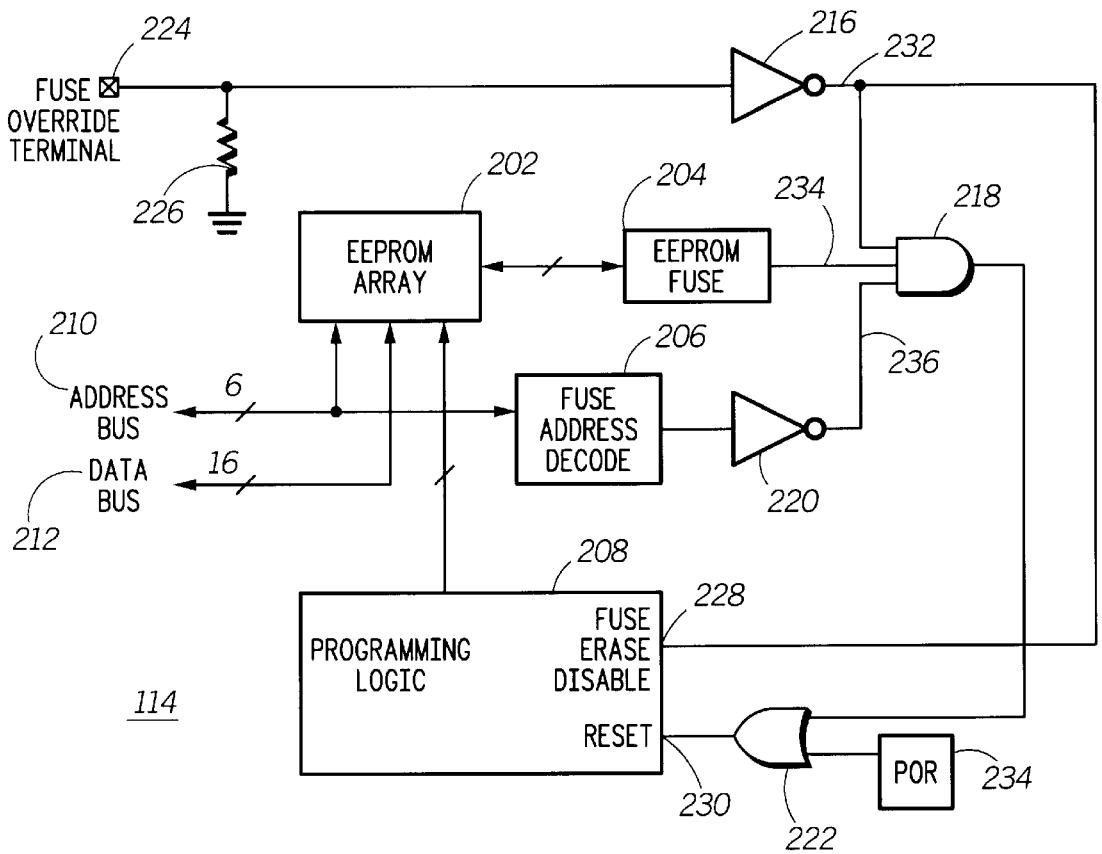
FIG. 2 is block diagram showing an EEPROM device in accordance with the preferred embodiment of the present invention.

With reference to FIG. 2, EEPROM 114 includes memory array 202, EEPROM fuse 204, fuse address decoder 206, programming logic 208, and power-on reset (POR) 214 operatively coupled as will be described. Memory array 202 is accessed as is known in the art via address bus 210 and communicates and receives data via data bus 212. Furthermore, when enabled, programming logic 208 operates in accordance with standard EEPROM programming principles for writing or erasing memory array 202. Power-on reset circuit 214 is of standard construction and is coupled via OR gate 222 to the reset input 230 of programming logic 208. In the preferred embodiment power-on reset 214 is only utilized during manufacturing of sensor 100 to avoid inadvertent programming of EEPROM memory array 202 and EEPROM fuse 204 that may occur due to random power-up of programming logic 208. Since POR 214 will not have to function in the operational environment it may be of a simple design such as are readily available in the art. And, as will be described, in a final programmed state, POR 214 output is essentially disabled.

A fuse override signal 232 is input via fuse override terminal 224 and buffered through inverter 216. During manufacturing of sensor 100, fuse override signal 232 is used to allow erasure of memory array 202 and EEPROM fuse 204. Erasure is required as the states of the EEPROM cells are generally unknown and uncontrolled during the manufacturing process of EEPROM 114. Fuse override signal 232 is normally held high, as the input to inverter 216 is normally pulled to ground, low, through resistor 226. Fuse override signal 232 is coupled to fuse erase disable input 228 of programming logic 208 and when high, disables programming logic 208 from erasing EEPROM fuse 204. When a voltage, a high signal, is applied to terminal 224 the output of inverter 216, fuse override signal 232, goes low thus enabling programming logic 208 for initial erasure of EEPROM fuse 204.

Memory array 202 may only be erased or written when programming logic 208 is enabled; programming logic 208 is enabled when its input 230 is low. This can only occur when EEPROM fuse 204 is in an unprogrammed (erased) state and in conjunction with other programming logic as will be described.

Figure 3:
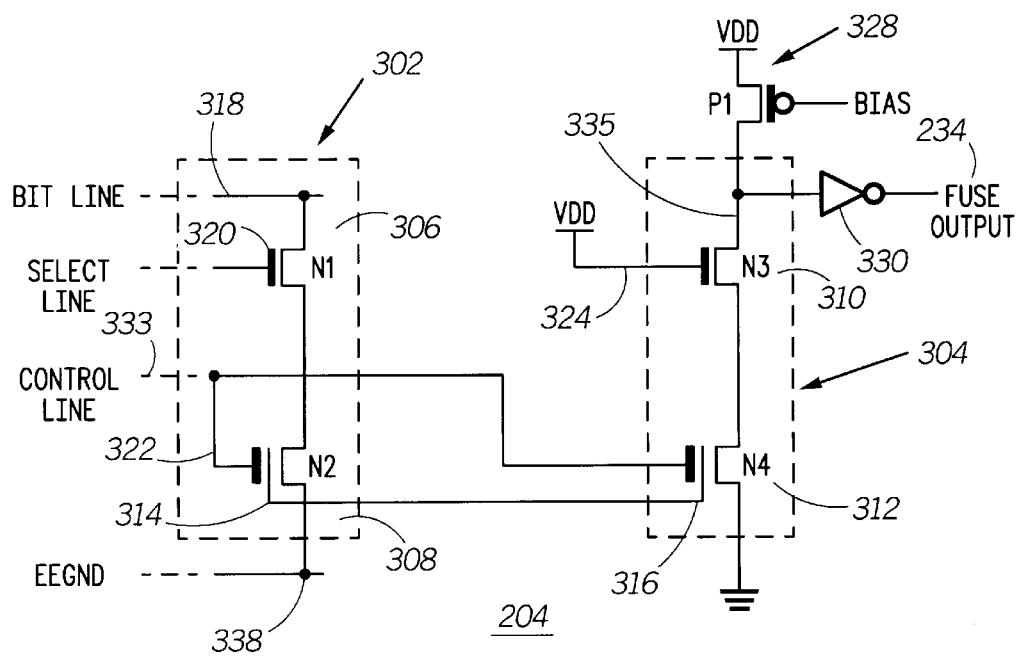
FIG. 3 is a schematic diagram illustrating an EEPROM fuse cell for use with the device illustrated in FIG. 2.

EEPROM fuse 204 is shown in more detail in FIG. 3. EEPROM fuse 204 includes a first cell 302 and a second cell 304 that make up two normal EEPROM bit cells. Each of the first 302 and second 304 cells include a first transistor 306 and 310 coupled to a second transistor 308 and 312. Each of the second transistors 308 and 312 have a floating gate 314 and 316 respectively. Each of the floating gates 314 and 316 of the second transistors 308 and 312 are coupled together. Because the floating gates 314 and 316 are coupled, a threshold voltage of transistor 312 will match a threshold voltage of transistor 308. Note that the first transistor 310 of the second cell 304 is disconnected from the memory array (shown in FIG. 2 at reference number 202). Each of the second transistors 308 and 312 further comprises a control gate 322 and 326 that are commonly coupled to a control line 333. The first transistor 310 of the second cell 304 has a drain terminal 335 coupled to a pull-up device 328, and the second transistor 312 of the second cell 304 is configured as a pull-down device.

As can be further seen in FIG. 3 bit cell 302 includes a bit line 318 and a select line 320 that are coupled to memory array 202 and, as such, has a distinct address that can be written, erased and read. As mentioned earlier, bit cell 304 is decoupled from memory array 202 with bit line 318 and select line 320 being decoupled from bit cell 304. Bit cell 304 is configured as a pull-down device with an active load. As shown, gate 324 of transistor 310 is coupled to VDD and the pull-up device, transistor 328, is biased in an on-state. EEPROM fuse signal 234 is formed from the drain terminal 335 of transistor 310 through inverting buffer 330. An EE GND terminal 338 is used as is known in the art during EEPROM 114 write, erase and read operations.

When EEPROM fuse 204 is erased, the threshold voltage of transistors 308 and 312 is shifted to a very high value. The result is transistor 312 is turned off and terminal 335 is pulled via transistor 328 to VDD. EEPROM fuse signal 234 is therefore low. When EEPROM fuse 204 is programmed the threshold voltage of transistors 308 and 312 is shifted to a negative value. The result is that transistor 312 is turned on and terminal 335 is pulled via transistors 310 and 312 to ground. EEPROM fuse signal 234 is then high.

The arrangement of EEPROM fuse 204 provides for drain disturb protection. Still referring to FIG. 3, with transistor 312 turned on, its drain is effectively coupled to ground. Therefore the situation of having the drain of 312 biased positively with respect to control gate 326, leading to potential drain disturb issues, is avoided.

During programming of EEPROM fuse 204, approximately 20 milliseconds (ms) is required to completely shift the threshold of the fuse cell during a write. However, the fuse cell output will go high within approximately 1–2 ms, long before the threshold of transistor 312 has shifted to its final desired value. To prevent the write cycle of EEPROM fuse 204 from shutting itself off prematurely, the fuse address is advantageously decoded using fuse address decoder 206.

EEPROM fuse signal 234, fuse override signal 232 and the fuse address decode signal 236, the output of fuse address decoder 206 buffered through inverter 230, are gated via AND gate 218 to an input of OR gate 222. The output of OR gate 222 is coupled to the reset input 230 of programming logic 208. Except during power-on, POR 214 output is normally low. The output of AND gate 218 will normally be high. Except during programming of EEPROM fuse 204, fuse address decode signal 236 will be high, as the output of fuse address decoder 206 will be low. Likewise, except when a high is placed at terminal 224, fuse override signal 232 will be high. Finally, in a programmed state, EEPROM fuse output 234 is high. Hence, the output of AND gate 218 is normally high and the output of OR gate 222 is normally high. The above arrangement effectively holds programming logic 208 reset and hence disabled.

With the fuse address properly decoded or with EEPROM fuse 204 unprogrammed or with a high signal present at terminal 224, i.e., fuse override signal 232 low, output of AND gate 218 will go low. With POR 214 output normally low, output of OR gate 222 will go low and programming logic 208 will be released from the reset state and enabled for writing to memory array 202. In the preferred embodiment of a sensor incorporating EEPROM 114, erasing of memory array 202 and EEPROM fuse 204 occurs during the testing of sensor 100 and before final packaging of the device. Programming of sensor 100, i.e., writing of calibration data to memory array 202 and programming of EEPROM fuse 204, occurs after final packaging of sensor 100. In a final packaged sensor 100, terminal 224 is not bonded out and no external access is provided to fuse override signal terminal 224. Thus it will not be possible to either erase EEPROM fuse 204 or apply the fuse override signal to enable programming logic 208 with sensor 100 in the final packaged state.

Figure 4:
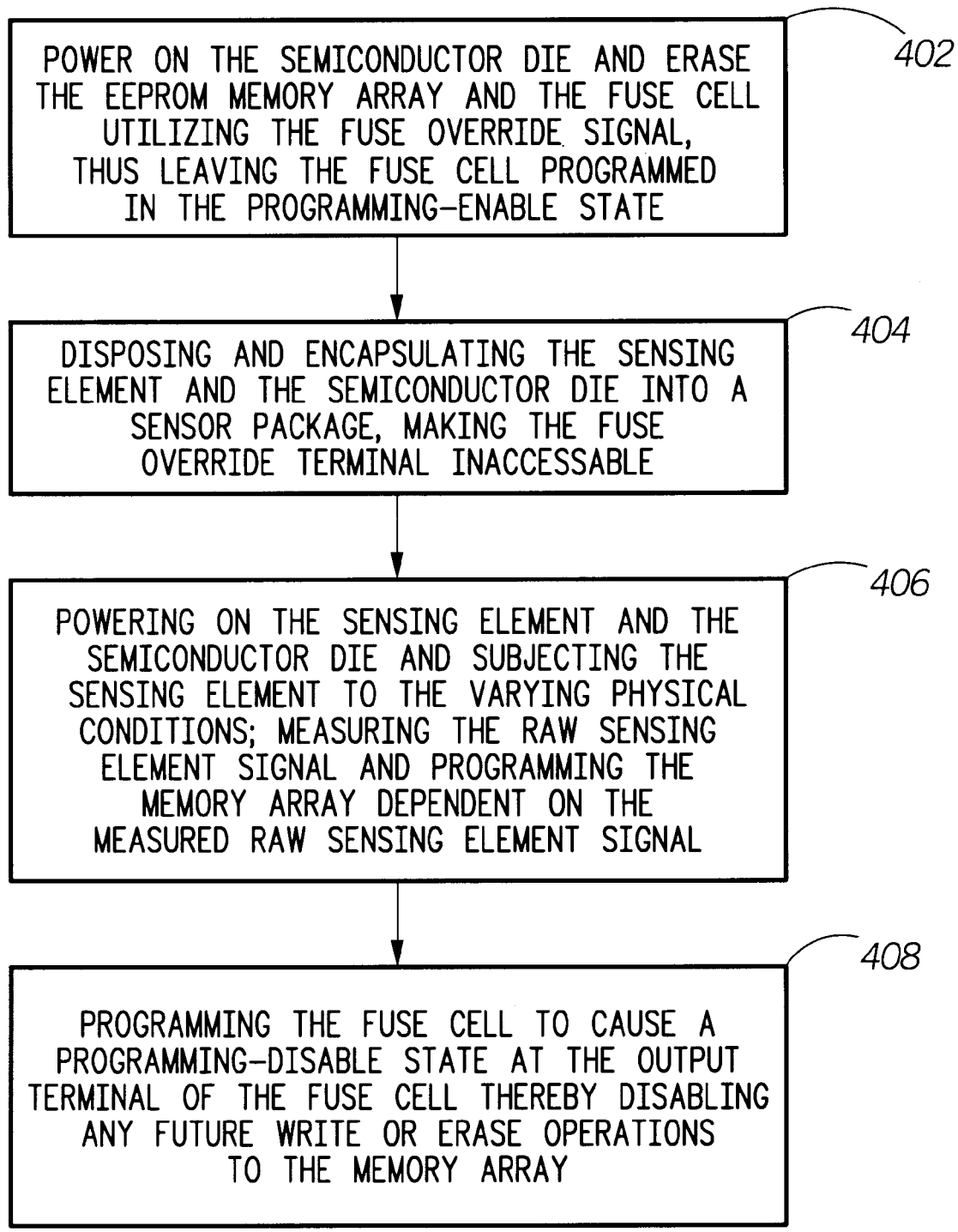
FIG. 4 is a flow diagram illustrating a method of programming an EEPROM device in accordance with the preferred embodiment of the present invention.

With reference to FIG. 4, a method 400 of programming the memory array 202 is shown. This process commences at a wafer level, where the memory array 202 is embodied in a semiconductor die form. At step 402, the semiconductor die is powered on, and the EEPROM memory array 202 is erased, including the EEPROM fuse 204, utilizing the fuse override signal to ensure that the programming logic 208 is enabled. When the EEPROM fuse 204 is erased it is forced to a programming-enable state. Note that the fuse override signal is provided by an external test fixture. The fuse override signal is necessary because when the semiconductor die is initially powered on, the logical state of the EEPROM fuse 204 is unknown, and if it comes up in a programming-disable logical state, erasure of the EEPROM memory array 202 and the fuse 204 would not be possible because the programming logic 208 will lock out any erasure by design.

Next, at step 404 the semiconductor die and a sensing element are disposed into a sensor package. Then the semiconductor die and a sensing element are encapsulated so that the fuse override terminal 224 is inaccessible from outside the sensor package. This encapsulation of the fuse override terminal 224 prevents unauthorized tampering with the memory array. With the EEPROM fuse 204 erased into the programming-enable logical state, the programming logic 208 is enabled. Calibration procedures are performed on the sensor under control of the test fixture, and the calibration data is written to memory array 202, step 406.

This step includes powering on the sensing element and the semiconductor die and subjecting the sensing element to the varying physical conditions; measuring the raw sensing element signal and programming the memory array dependent on the measured raw sensing element signal.

Finally, EEPROM fuse 204 is addressed and written, step 408, by programming the fuse cell to cause a programming-disable state at the output terminal of the fuse cell. By programming the fuse cell to cause a programming-disable state at the output terminal of the fuse cell all future memory writes/erases are locked out. Note that during programming of the fuse cell an electrical charge is transferred from the first cell to the second cell via the coupled floating gates 314 and 316 to provide the programming-disable state at the output terminal of the fuse cell.

In the preferred embodiment an electronically calibrated pressure sensor has been described. More particularly, the sensor has been described to include an EEPROM with robust data protection. An EEPROM fuse is employed which in a programmed state disables the write/erase program logic. The EEPROM fuse may only be erased upon a valid fuse override signal the input for which in a final packaged device is inaccessible.

What is claimed is:

1. A device comprising:
    a semiconductor die having a memory array with a fuse cell having an output terminal providing a fuse signal indicative of programmability of the memory array and the fuse cell, the fuse signal having a programming-enable logical state and a programming-disable logical state;
    a fuse override terminal for receiving a fuse override signal; and
    programming logic operatively coupled to the memory array for enabling and disabling programming of the memory array and the fuse cell, wherein when the output terminal of the fuse cell provides the programming-enable logical state the programming logic enables erasing and writing data to the memory array and the fuse cell, when the output terminal of the fuse cell provides the programming-disable logical state the programming logic disables erasing and writing data to the memory array and the fuse cell, and when the output terminal of the fuse cell provides the programming-disable logical state, and the fuse override signal is applied to the fuse override terminal, the programming logic enables erasing and writing data to the memory array and the fuse cell.

2. A device in accordance with claim 1 wherein the fuse cell comprises:
    a first cell and a second cell, each of the first and second cells comprised of a first transistor coupled to a second transistor, each of the second transistors having a floating gate, each of the floating gates of the second transistors are coupled together.

3. A device in accordance with claim 2 wherein the first transistor of the second cell is disconnected from the memory array.

4. A device in accordance with claim 3 wherein each of the second transistors further comprises a control gate, wherein each of the control gates are commonly coupled.

5. A device in accordance with claim 4 wherein the first transistor of the second cell has a drain terminal; and
    a pull-up device is coupled to the drain terminal of the first transistor of the second cell.

6. A device in accordance with claim 5 wherein the second transistor of the second cell is configured as a pull-down device.

7. A device in accordance with claim 1 further comprising:
    a sensing element operatively coupled to the semiconductor die.

8. A device in accordance with claim 7 wherein the sensing element comprises one of a pressure sensing element and a temperature sensing element.

9. A device in accordance with claim 7, wherein the sensing element comprises a piezoresistive pressure sensing element.

10. A memory device comprising:
    an EEPROM memory array;
    an EEPROM fuse having an output;
    programming logic coupled to the EEPROM memory array and the EEPROM fuse;
    a fuse override circuit coupled to the programming logic; and
    a fuse override terminal coupled to the fuse override circuit, wherein in a final programmed state the output of the EEPROM fuse is pulled to a logical state.

11. A device in accordance with claim 10 wherein the EEPROM fuse comprises:
    a first cell and a second cell, each of the first and second cells comprised of a first transistor coupled to a second transistor, each of the second transistors having a floating gate, each of the floating gates of the second transistors are coupled together.

12. A device in accordance with claim 11 wherein the first transistor of the second cell is disconnected from the memory array.

13. A device in accordance with claim 12 wherein each of the second transistors further comprises a control gate, wherein each of the control gates are commonly coupled.

14. A device in accordance with claim 13 wherein the first transistor of the second cell has a drain terminal; and
    a pull-up device is coupled to the drain terminal of the second cell.

15. A device in accordance with claim 14 wherein the second transistor of the second cell is configured as a pull-down device.

16. A device in accordance with claim 10 further comprising:
    a sensing element operatively coupled to the memory device.

17. A device in accordance with claim 16 wherein the sensing element comprises one of a pressure sensing element and a temperature sensing element.

18. A device in accordance with claim 16, wherein the sensing element comprises a piezoresistive pressure sensing element.

19. A method of programming a device comprising the steps of:
    fabricating a semiconductor die, the semiconductor die comprising a memory array having a fuse cell with an output terminal providing a fuse signal indicative of programmability of the memory array and the fuse cell, the fuse signal having a programming-enable state and a programming-disable state, a fuse override terminal for receiving a fuse override signal, and programming logic operatively coupled to the memory array for enabling and disabling programming of the memory array and the fuse cell dependent on a logical state of the fuse signal and the fuse override signal;
    powering on the semiconductor die and supplying the fuse override signal and erasing the memory array and programming the fuse cell to cause a programming-enable state at the output terminal of the fuse cell;

providing a sensing element with at least one output terminal for providing a raw sensing element signal indicative of varying physical conditions proximate the sensing element;

disposing the sensing element and the semiconductor die into a sensor package, the semiconductor die further comprising a calibration circuit with a signal input terminal and a signal output terminal, wherein the at least one output terminal of the sensing element is operatively coupled to the signal input terminal of the calibration circuit, and the signal output terminal provides a conditioned signal dependent on the raw sensing element signal and a logical state of at least one location of the memory array;

powering on the sensing element and the semiconductor die and subjecting the sensing element to the varying physical conditions;

measuring the raw sensing element signal and programming the memory array dependent on the measured raw sensing element signal; and programming the fuse cell to cause a programming-disable state at the output terminal of the fuse cell.

20. A method in accordance with claim 19 further comprising the step of:

encapsulating the sensing element and the semiconductor die into a package after the step of programming the fuse cell to cause a programming-enable state at the output terminal of the fuse cell.

21. A method in accordance with claim 20 wherein the step of encapsulating occurs before the step of subjecting the sensing element to varying physical conditions.

22. A method in accordance with claim 21 wherein the fuse cell comprises a first cell and a second cell, each of the first and second cells comprised of a first transistor coupled to a second transistor, each of the second transistors having a floating gate, each of the floating gates of the second transistors are coupled together, the method further comprising the step of:

transferring a charge from the first cell to the second cell and providing the programming-disable state at the output terminal of the fuse cell.

23. A method in accordance with claim 22 wherein the step of providing the programming-disable state causes the first transistor of the second cell to be coupled to a ground potential.

* * * * *